United States Patent

[11] 4,054,895
[45] Oct. 18, 1977

Ham

[54] SILICON-ON-SAPPHIRE MESA TRANSISTOR HAVING DOPED EDGES

[75] Inventor: William Edward Ham, Mercerville, N.J.

[73] Assignee: RCA Corporation, New York, N.Y.

[21] Appl. No.: 754,689

[22] Filed: Dec. 27, 1976

[51] Int. Cl.² .......................................... H01L 29/78
[52] U.S. Cl. .................................. 357/23; 357/49; 357/52; 357/91; 357/56
[58] Field of Search .................. 357/23, 52, 49, 91, 357/56

[56] References Cited
U.S. PATENT DOCUMENTS

| 3,890,632 | 6/1975 | Ham et al. | 357/23 |
| 4,015,279 | 3/1977 | Ham | 357/52 |

*Primary Examiner*—Stanley D. Miller, Jr.
*Assistant Examiner*—Joseph E. Clawson, Jr.
*Attorney, Agent, or Firm*—H. Christoffersen; W. L. Muckelroy

[57] ABSTRACT

Instabilities in the leakage current and threshold voltage of a field effect transistor on an insulator substrate, at both room temperature and after operation at relatively high temperatures (150° C), are substantially reduced by selectively doping edge regions adjacent the transverse side surfaces of the channel region of the field effect transistor, wherein the breakdown voltage of the channel-to-drain junction is substantially increased. Atoms are placed in these edge regions to provide therein a carrier concentration of at least $5 \times 10^{16}$ atoms-cm$^{-3}$ of the opposite conductivity type to that of the source and drain regions. The doped edge region extends partly across said channel region and extends fully across the side surface at the end of the source region.

9 Claims, 16 Drawing Figures

SILICON-ON-SAPPHIRE MESA TRANSISTOR HAVING DOPED EDGES

This invention relates generally to semiconductor devices. More particularly, the invention relates to stabilized field effect transistors on insulating substrates with a high drain breakdown voltage.

Instabilities, such as excess leakage current at zero gate voltage of certain silicon-on-sapphire field effect transistors have been noted. These instabilities were especially noticeable after the field effect transistors were operated at temperatures in excess of about 150° C or at gate fields in excess of $\approx 10^6$ V/cm and were exhibited most frequently by N-channel SOS/FET's (silicon-on-sapphire field effect transistors). Prior art N-channel SOS/FET's also frequently exhibited substantial non-linearities (kinks) in the drain characteristics in addition to relatively high source-drain leakage currents. Prior semiconductor devices substantially overcame the high leakage currents at the expense of lowering the breakdown voltage of the field effect transistor, specifically the breakdown voltage of the P-N junction between the channel and drain. For example, U.S. Pat. No. 3,890,632 issued June 17, 1975 to Ham et al. discloses an embodiment of a stabilized field effect device which comprises a mesa of single crystal semiconductor material on an insulating substrate. The mesa has side surfaces extending transversely from the substrate and a channel region between opposite side surfaces. Selectively doped edge regions of the channel region, adjacent the opposite side surfaces, have more conductivity modifiers therein than the remainder of the channel region adjacent a top surface, whereby the threshold voltage in these doped regions is increased and leakage currents are stabilized. One problem with the manner in which this field effect transistor is constructed is the selective doping of the entire channel region at the side surfaces of the transistor. By completely doping all of the side surfaces of the field effect transistor, the breakdown voltage between the channel and drain of such a device is substantially lowered.

The present semiconductor FET device of the invention wherein a high drain breakdown voltage and simultaneously a stable channel edge region are achieved comprises doping the channel edge regions adjacent the source region with a high concentration of active carriers to raise the threshold voltage at the channel edge region adjacent the source above that of the normally operating FET and to provide that the portion of the channel edge region adjacent the drain region is not doped with an additional concentration of active carriers. This process maintains a higher breakdown voltage between the channel region at the edge and the drain region.

IN THE DRAWINGS

FIG. 1 is a perspective sectional view of an SOS/FET embodying the invention taken along the line 1—1 of FIG. 2a;

FIGS. 2a and 2b are vertical sectional views of the device illustrated in FIG. 1 taken along the lines 2a—2a and 2b—2b, respectively, of FIG. 1;

Figure 1:
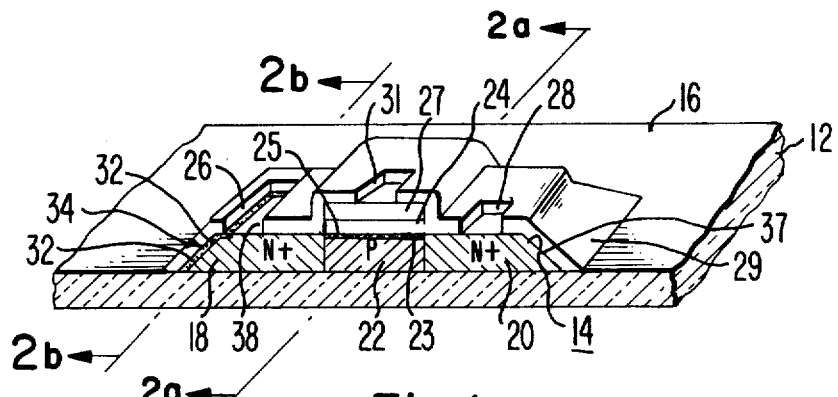
Figure 2A:
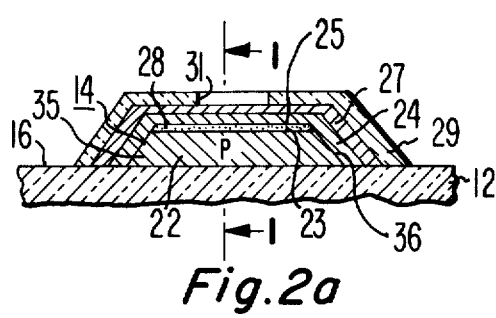
Figure 2B:
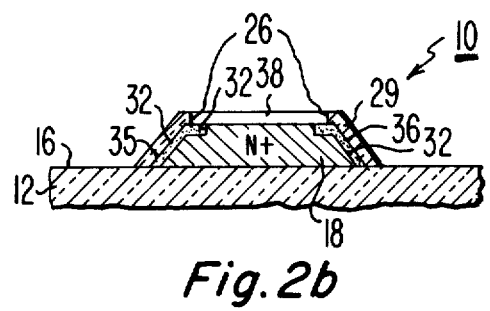

Referring to FIGS. 1, 2a and 2b of the drawing, there is shown one embodiment of a stabilized field effect mesa transistor (FET) 10 having a means therein for providing a high breakdown voltage at the junction between the channel and drain at the edge regions. The FET 10 comprises a substrate 12 of electrically insulating material, such as sapphire or spinel, for example. An island, or mesa 14, of a layer of semiconductor material, such as P-type silicon, germanium, or gallium arsenide, for example, is epitaxially deposited on a smooth, flat surface 16 of the insulating substrate 12. The mesa 14 comprises two spaced-apart N+ source and drain regions 18 and 20, respectively, for example, separated by a P-channel region 22, for example. The portions of the source region 18, drain region 20, and channel region 22 immediately adjacent the transverse surfaces 34, 35, 36 and 37 of the mesa transistor are referred to herein respectively as the source edge region, the drain edge region, and the channel edge region.

During the operation of the field effect transistor 10 in the enhancement mode, an N-channel, the space between the source region 18 and the drain region 20 wherein conduction occurs via electrons, is formed in the upper portion 23 of the channel region 22 adjacent the surface 25 of the channel region 22 remote from the substrate 12. [This N-channel also typically forms on the channel edge regions with a lower threshold voltage.] (See FIG. 2a). The channel region 22 is covered with an insulator 24 of electrically insulating material, such as silicon dioxide, for example. The insulator 24 is aligned with the channel region 22 and functions as a gate insulator. This insulator may also extend over the source region or drain region, or both. A gate 27 of phosphorous doped polycrystalline silicon is deposited over the insulating layer 24. Contact holes 26 and 28 for the source and drain are opened in an insulating layer 29. The insulating layer 29 of doped silicon dioxide, for example, is deposited over the source and drain regions 18 and 20 and also over the gate 27 and acts as a source for doping the source and drain regions, and sometimes also the gate. An additional contact hole 31 is formed in the insulator 29 over the gate 27, to provide a means for making electrical contact to the gate.

The opening 26 to the source region 18 is considerably larger than the opening 28 to the drain region 20. See FIG. 2b. The opening 26 is made sufficiently large to provide an adequate area for electrically contacting a selectively doped area 32 of the source region 18 adjacent to the transverse surface 34, adjacent the source region 18, but not the surface 37 adjacent the drain region 20 as illustrated in FIG. 1. The area 32 is also adjacent the side surfaces 35 and 37 in addition to the surface 38 shown in FIG. 2b.

The transverse surfaces 34, 35 and 36 of the semiconductor mesa 14 extend transversely from the surface 16 of the insulating substrate 12 and the selective doped area 32 is adjacent to the transverse side surfaces 34, 35 and 36.

If the source and drain regions 18 and 20, respectively, of the field effect transistor 10 are of N conductivity, the selective doping of the transverse surfaces 34, 35 and 36 is with conductivity modifiers of the opposite type, that is, with P conductivity. The original (starting)

concentration of carriers of the semiconductor mesa 14 may be in the neighborhood of about $10^{14} - 10^{16}$ atoms-$cm^{-3}$.

The formation of a part of the area 32 on the surface 38 such that the contact hole 26 exposes a contiguous part of the area 32 is another important, but independent, feature of the FET 10. A contact adjacent the area 32 so exposed electrically connects the source region 18 to the channel region 22 other than through the PN junction at the source-channel interface via the selectively doped area 32 (See FIGS. 5a and 5b).

In a preferred embodiment of the FET 10, wherein the FET 10 is an SOS/FET, the carrier concentration of the selectively doped edge area 32, adjacent the transverse surfaces 34, 35 and 36 should be at least $5 \times 10^{16} cm^{-3}$. Also, the selective doping of the edge regions 34, 35 and 36 is always with a dopant material of an opposite conductivity type to that present in the source and drain regions 18 and 20 of the FET 10.

Figure 3:
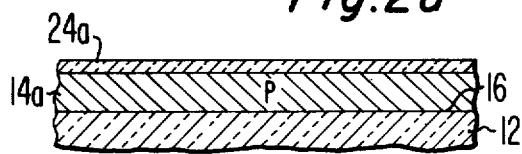
FIGS. 3 and 4 are diagrammatic views illustrating various steps of the method of making the device.

The structure of the novel stabilized field effect transistor having a high breakdown voltage at the junction between the channel and the drain will be better understood from the following description of a method for making the novel structure. Referring now to FIG. 3 of the drawing, there is shown the insulating substrate 12 of single crystal sapphire, for example, having the upper surface 16, a polished surface preferably substantially parallel to the [1102] crystallographic plane of the substrate 12. A semiconductor layer 14a of single crystal P-silicon, for example, is epitaxially grown on the surface 16 (with a [100] orientation), by the pyrolysis of silane at about 960° C in H2, for example. The semiconductor layer 14a has a thickness of about 1 micrometer and a carrier concentration of about $10^{14} cm^{-3}$ and $10^{16} cm^{-3}$, for example.

An insulating layer 24a of silicon dioxide, or other etch-resistant and conductivity-modifier impermeable material having a thickness of between about 1000 Angstroms and 2000 Angstroms, is deposited on the semiconductor layer 14a. The layer 24a may be deposited or grown by any means known in the art, such as growing the layer 24a by oxidizing the semiconductor layer 14a at 900° C in steam (or at 940° C in wet oxygen).

Figure 4:
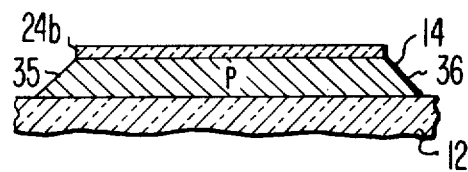

A portion of the insulating layer 24a is removed, using photolithography as by etching with a buffered hydrofluoric acid solution, for example, leaving a remaining portion, insulating layer 24b, as shown in FIG. 4. The insulating layer 24b is an etch-resistant and conductivity modifier impermeable mask for defining the mesa 14 of the semiconductor material in a manner known in the art. The mesa 14 is defined, for example, by etching with a hot n-propanol potassium hydroxide etching solution.

Figure 6:
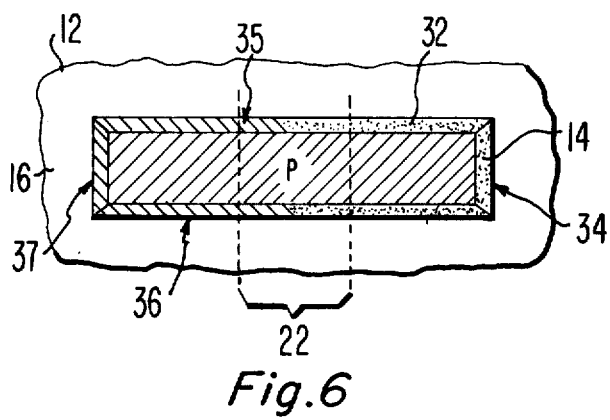
FIGS. 6–10 are views illustrating additional steps of the method of making the stabilized device.

The mesa 14 has sloping transverse edges, or side surfaces 34, 35, 36 and 37. Only the transverse surfaces 35 and 36 are visible in FIG. 4 (transverse surfaces 34 and 37 being shown in FIGS. 2a and 2b). The selective doping of the semiconductor mesa 14 is carried out preferably by ion implantation of dopant atoms to provide the selectively doped area 32 on the transverse surfaces 34, 35 and 36 and top surface 38 adjacent the source region 18, for example. The area 32 also extends partially into the channel region 22, as shown in FIG. 6.

A vertical dose of boron ions from $2 \times 10^{13}$ atom-$cm^{-2}$ to $2 \times 10^{16}$ atom-$cm^{-2}$, for example, may be implanted (at an energy of 150 KEV) into the mesa 14 to stabilize the current voltage characteristic of the FET and lower the leakage current. The dose is implanted according to the pattern of the oxide layers 24c and 39 shown by FIGS. 5a and 5b wherein the implantation is only partially along the area for the channel region 22 and extends onto the top surface of the source region 18 such that contact may be made thereto by a source electrode, for example (See FIGS. 13 and 14). The implanted area 32 provides stability without compromising breakdown voltage in an N channel FET of the type described. The absence of a low breakdown voltage is achieved by not implanting the ions completely across the side surfaces 35 and 36 adjacent the channel region 22 illustrated in FIG. 6. The dopants implanted into the transverse surfaces 34, 35 and 36 also provide P+ doping for the area 32 extending onto the top surface 38 of the source region 18. The area 32 extends from the side surfaces 34, 35 and 36 a distance of about 1 micron or less, for example, in the manner shown in FIG. 5b, or may be confined to the edges.

It is critical to the transistor device of the present invention that the doped area 32 adjacent the opposite transverse surfaces 35 and 36 of the channel region 22 be selectively doped, i.e., doped only at chosen areas such as only partially across the channel region 22 toward the drain region 20 in the present transistor 10. If the transverse surfaces adjacent the entire channel region are selectively doped so as to interconnect the source and drain regions 18 and 20, the operation of the field effect transistor is materially affected, that is, a low breakdown voltage at the junction between the channel region and the drain region is manifested (particularly for high selective dopings).

Figure 10:
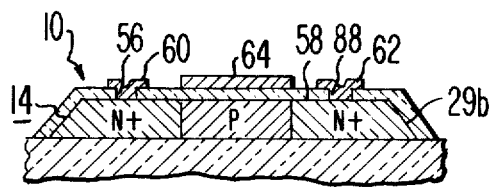
Figure 11A:
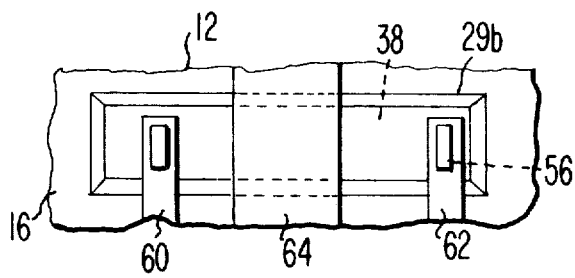
FIGS. 11a, 11b, 12a and 12b are top views of particular contact arrangements for polycrystalline silicon gate and metal gate SOS/FET's.
Figure 12A:
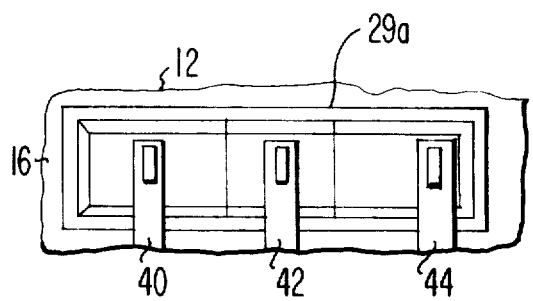
Figure 11B:
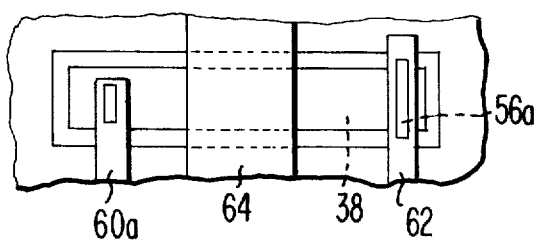
Figure 12B:
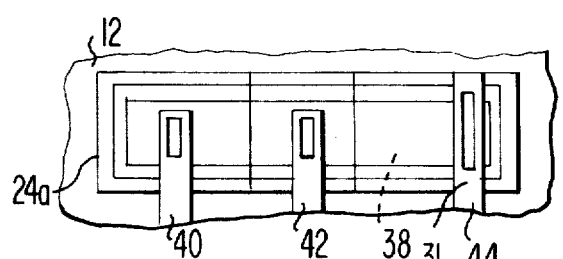

After the selective doping of the edge area 32, including portions thereof which extend to the surface 38 of the source region 18, an FET having a high breakdown voltage can be fabricated with either a doped polycrystalline silicon gate (FIGS. 8, 11a and 11b) or a metal gate (FIGS. 10, 12a and 12b).

Figure 5A:
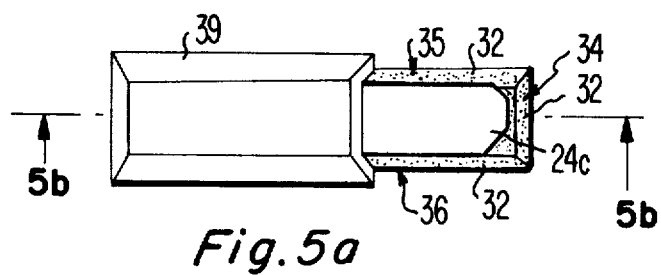
FIG. 5a is a top view showing a unique mask pattern.

To make the FET 10 with a doped polycrystalline silicon gate as shown in FIG. 1, and an electrode pattern as shown in FIG. 12, the silicon dioxide layer 24b shown in FIG. 4 is photolithographically defined to produce a silicon dioxide layer 24c illustrated in FIG. 5a. Thereafter, another defined silicon dioxide layer 39 is photolithographically produced such that its pattern as shown in FIGS. 5a and 5b exposes only portions of the transverse surfaces 35 and 36, the entire surface of the transverse surface 34, and the top surface 38 including all of the source region 18 and a portion of the top channel region 22.

Figure 5B:
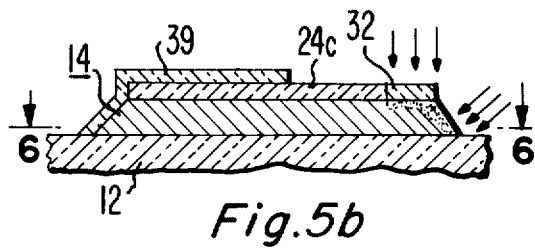
FIG. 5b is a vertical sectional view of the mask pattern shown in FIG. 5a taken along the line 5b–5b.
Figure 7:
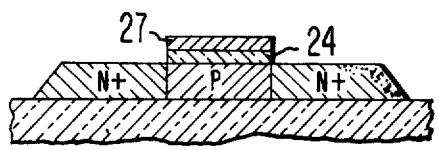

As shown in FIG. 7, first the gate 27 of doped polycrystalline silicon is deposited by vapor deposition over the silicon dioxide gate insulator 24 formed after the silicon dioxide layers 24c and 39 are removed (FIGS. 5a and 5b). The gate insulator layer is formed adjacent the mesa 14 and defined to align with the channel region 22. Portions of the gate insulator layer are etched away using known photolithographic techniques to provide the insulated gate 27 and gate insulator 24 as shown in FIG. 7.

Using the gate electrode 27 as an etch-resistant mask, the N+ source and drain regions 18 and 20 are formed by introducing N dopants therein as further shown in FIG. 7. The N+ source and drain regions 18 and 20 can be formed by introducing phosphorous, for example, into the mesa 14 either in a gaseous diffusion furnace, for example, or by ion implantation, or from a doped oxide. During this operation, the gate 27 of doped polycrystalline silicon can be simultaneously doped increasing its conductivity.

Figure 8:
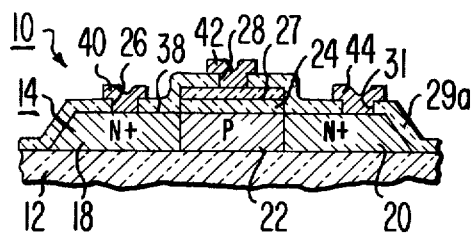

After the source and drain regions 18 and 20 are formed, the mesa 14 and the gate 27 are covered with the insulating layer 29 as shown in FIG. 8. Openings 26, 28 and 31 are formed in the insulating layer 29 (photolithographically), for electrical contacts 40, 42 and 44 to the source and drain regions 18 and 20 and to the gate 27, respectively, as shown in FIG. 8. The contacts 40, 42 and 44 are also photolithographically formed with known techniques.

Figure 9:
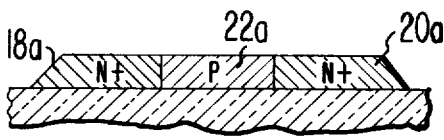

Alternatively, to make the present field effect transistor of the novel invention with a metal gate, the insulating layers 39 and 24c shown in FIGS. 5a and 5b are stripped away to expose the mesa 14 shown in FIG. 6. Next, N+ source and drain regions 18a and 20a and the channel region 22a are formed by conventional photolithographic techniques, such as by diffusion of a suitable dopant (phosphorus) into the mesa 14 from a gaseous or doped oxide source, or by ion implantation, for example, as shown in FIG. 9. Of course, the channel region 22a is suitably masked.

The mesa 14 is next oxidized to form an insulating layer 29b, shown in FIG. 10, openings 56 and 58 are formed over the source and drain regions 18a and 20a for electrical contacts 60 and 62, respectively, as shown in FIG. 10.

Next, a metal gate electrode 64 is formed, and the electrical contacts 60 and 62 are made to the source and drain regions 18a and 20a, via the source and drain openings 56 and 58, respectively, (see FIG. 11a). Vapor deposited metal, such as aluminum, for the electrode 64, is defined as shown in FIG. 10, for example. The gate electrode 64 has a thickness of about 14,000 Angstroms, for example.

FIG. 11a shows a plan view of the novel aluminum gate shown in cross-section in FIG. 10, wherein the opening 56 is confined within the surface 38. FIG. 11b shows an alternate arrangement to FIG. 11a with an opening 56a extending beyond the surface 38 onto side surface regions comprising the area 32.

FIG. 12a is a plan view of the novel polycrystalline silicon device shown in cross-section in FIG. 8. FIG. 12b shows the metal gate device of FIG. 12a with an enlarged contact opening 31 extending over the surface 38 and encompassing a portion of the area 32 at each sidewall of the mesa 24a.

Insulated gate field effect transistors treated to provide the aforementioned doped area 32 adjacent the transverse surfaces 34, 35 and 36 and top surface 38 of the mesa 14 have relatively lower source-to-drain leakage under zero bias conditions with no apparent decrease in breakdown voltage in comparison with similar field effect transistors not so treated. Apparently, the selective doping of the transverse surfaces 34, 35 and 36, such that the selectively doped area 32 does not extend entirely across the channel region 22 and such that the area 32 electrically connects the channel region 22 to the source contact changes the physical and chemical properties of these regions in a novel fashion.

Stabilized field effect transistors made in accordance with the present invention, have current leakage levels at zero bias, of 2-3 orders of magnitude less than those devices without such edge stabilization in some cases. In addition, electrically connecting the silicon interfacing the substrate at the channel region 22 via these conductive edge regions to the source eliminates or substantially reduces a kink in the drain current-voltage characteristic of the field effect transistor which would otherwise be present. The amount of selective doping in the novel device is not limited by breakdown voltage considerations for the FET because the selective doping does not extend across the entirety of the channel region. Therefore, the novel selectively doped area does not interconnect the source and drain regions and does not provide a P+-N+ junction at the channel-drain interface which would break down under low voltage because of additional doping in the channel region.

A carrier concentration of between $5 \times 10^{16}$ atom-cm$^{-3}$ and $1 \times 10^{21}$ atom-cm$^{-3}$ for the selectively doped transverse edges and the selectively doped top surface of a conductivity type opposite that of the source-drain regions is useful to stabilize the FET's of the type described and, specifically, to eliminate or substantially reduce a kink in the drain current-voltage characteristic of these devices.

While the novel stabilized devices were described and illustrated as N channel insulated gate FET's, it is also within the contemplation of the present invention to ion-implant N type dopants into the regions adjacent the side surfaces of mesas of P channel FET's to improve their stability with regard to leakage current, threshold voltage, breakdown voltage, and hysteresis in the current-voltage characteristic.

What is claimed is:
1. In a semiconductor device comprising:
   a substrate of electrically insulating material,
   a mesa of single crystal semiconductor material on said substrate,
   said mesa having transverse surfaces extending transversely from said substrate,
   means defining a field effect transistor having source and drain regions and a channel region, said channel region extending between said source and drain regions and between two of said transverse surfaces, and doped edge regions, in said channel region adjacent said two transverse surfaces of said channel region, having more conductivity modifiers than in the remainder of said channel region,
   said conductivity modifiers being of the opposite conductivity type as that of said source and drain regions,
   the improvement comprising said doped edge regions being extended only partly across said channel region adjacent a portion of the two transverse surfaces of the channel region and further comprising the doped edge region being extended adjacent the side surfaces only in said source region, whereby the breakdown voltage at any junction including said channel region at a side surface is substantially the same as the breakdown voltage of said field effect transistor.

2. A semiconductor device as described in claim 1, further comprising:
   an electrically conductive electrode connected to said source region,
   said doped edge region being electrically connected to said electrically conductive electrode.

3. A semiconductor device as described in claim 2, wherein said mesa has a top surface substantially parallel to said substrate and wherein said doped edge region is extended to said top surface adjacent said source region.

4. A semiconductor device as described in claim 3, wherein said electrode connects to said doped edge region at the top surface.

5. A semiconductor device as described in claim 2, wherein said electrode connects to said doped edge region at a side surface.

6. A semiconductor device as described in claim 4 wherein:
said mesa of semiconductor material is silicon comprising said source and drain regions of one type conductivity separated by said channel region,
insulating material is over said regions, and
said doped edge regions have a carrier concentration of conductivity modifiers of between about $5 \times 10^{16}$ cm$^{-3}$ and $10^{21}$ cm$^{-3}$, said conductivity modifiers being of a type opposite that of said source and drain regions.

7. A semiconductor device as described in claim 6 wherein:
said device is an enhancement N-channel field effect transistor and said conductivity modifiers are of a conductivity type opposite that of said source and drain regions.

8. A semiconductor device as described in claim 6 wherein:
said device is an N-channel field effect transistor,
said substrate is sapphire,
said mesa of semiconductor material is P-type silicon having N-type source and drain regions,
insulating material is over said regions,
a gate electrode is on said insulating material over said channel region including said two side surfaces of said channel region, and
said doped edge regions have a carrier concentration of conductivity modifiers of at least $5 \times 10^{16}$ cm$^{-3}$ in said channel region, at least a portion of said conductivity modifiers being ion implanted.

9. A semiconductor device as described in claim 8 wherein:
said gate electrode is doped polysilicon,
said conductivity modifiers are of P-type conductivity, whereby the threshold voltage at said doped edge regions is higher than the operating threshold voltage of said field effect transistor.

* * * * *